US006765778B1

(12) United States Patent
Du et al.

(10) Patent No.: US 6,765,778 B1
(45) Date of Patent: Jul. 20, 2004

(54) INTEGRATED VERTICAL STACK CAPACITOR

(75) Inventors: Yang Du, Austin, TX (US); Ertugrul Demircan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/407,701

(22) Filed: Apr. 4, 2003

(51) Int. Cl.⁷ .............................................. H01G 4/30
(52) U.S. Cl. ................................. 361/301.4; 361/329
(58) Field of Search ..................... 361/301.4, 306.3, 361/329

(56) References Cited

U.S. PATENT DOCUMENTS

| 5,208,725 | A  | 5/1993  | Akcasu          |
| 5,978,206 | A  | 11/1999 | Nishimura et al.|
| 6,407,907 | B1 | 6/2002  | Ahiko et al.    |
| 2002/0171997 | A1 | 11/2002 | Togashi et al. |

OTHER PUBLICATIONS

Aparicio et al., "Capacity Limits and Matching Properties of Integrated Capacitors," *IEEE Journal of Solid State Circuits*, Mar. 2002, vol. 37, No. 3, pp. 384–393.

Samavati et al., "Fractal Capacitors," *IEEE Journal of Solid State Circuits*, Dec. 1998, vol. 33, No. 12, pp. 2035–2041.

Sowlati et al., "High Density Capacitance Structures in Submicron CMOS for Low Power RF Applications," *ISLPED '01*, Aug. 6–7, 2001, Huntington Beach, California, USA, p. 243–246.

Primary Examiner—Anthony Dinkins
(74) Attorney, Agent, or Firm—Robert L. King; Joanna G. Chiu

(57) ABSTRACT

An integrated circuit capacitor (60) uses multiple electrically conductive stacks (63–68, 70) to optimize capacitance density. A second stack (70) is a first nearest neighbor to a first stack (66). A third stack (65) is a second nearest neighbor to the first stack. Each of the three stacks defines vertices of an isosceles triangle (20) formed in a plane substantially perpendicular to the three stacks. The isosceles triangle does not have a ninety degree angle. The isosceles triangle may also be implemented as an equilateral triangle.

22 Claims, 3 Drawing Sheets

INTEGRATED VERTICAL STACK CAPACITOR

FIELD OF THE INVENTION

This invention relates generally to semiconductor circuits, and more specifically, to semiconductor capacitor structures.

BACKGROUND OF THE INVENTION

Integrated circuits use a variety of known interconnect capacitor structures for their excellent linearity and high quality factor, Q. These capacitors are essential components in many analog, mixed signal and RF integrated circuits. Such capacitors typically use multiple metal layers to form a parallel plate or a parallel finger capacitor. The parallel plates or parallel fingers are arranged in an array structure and consume a significant amount of circuit area because of their relatively low capacitive density. These capacitors rely on or partially rely on vertical inter-layer capacitive coupling and therefore do not take full advantage of semiconductor lithography and IC process technology. As a consequence, these capacitors have relatively low capacitance density and thus consume a considerable amount of circuit area. For example, in a vertical direction, circuit cross talk imposes a severe limit to the minimum dielectric thickness which often stays unchanged for several technology generations. In a lateral direction, the plates and fingers are separated by a minimum space determined primarily from lithography and process capability. This minimum spacing is typically much smaller than the interlayer dielectric thickness, leading to a larger lateral capacitive coupling (or lateral flux) in modern IC process technologies. In addition, as IC pattern transfer technologies improve, uniformity control of dielectric thickness also becomes less precise than lateral pattern definition.

In the past, one form of capacitor structure used horizontal parallel metallic bars or fingers separated by a dielectric material. The capacitance of such structures consists of both lateral and vertical capacitive coupling. Since the vertical capacitive coupling does not scale as technology advances, the capacitive density is not optimized to present-day technology capability. To obtain more lateral capacitive coupling, alternative capacitor structures have been proposed including vertical stacks placed in orthogonal coordinates and fractal structures. These capacitors have either a relatively large terminal loss due to the necessity of having to terminate in different metal layers or suffer from corner rounding errors that reduce desired capacitance.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
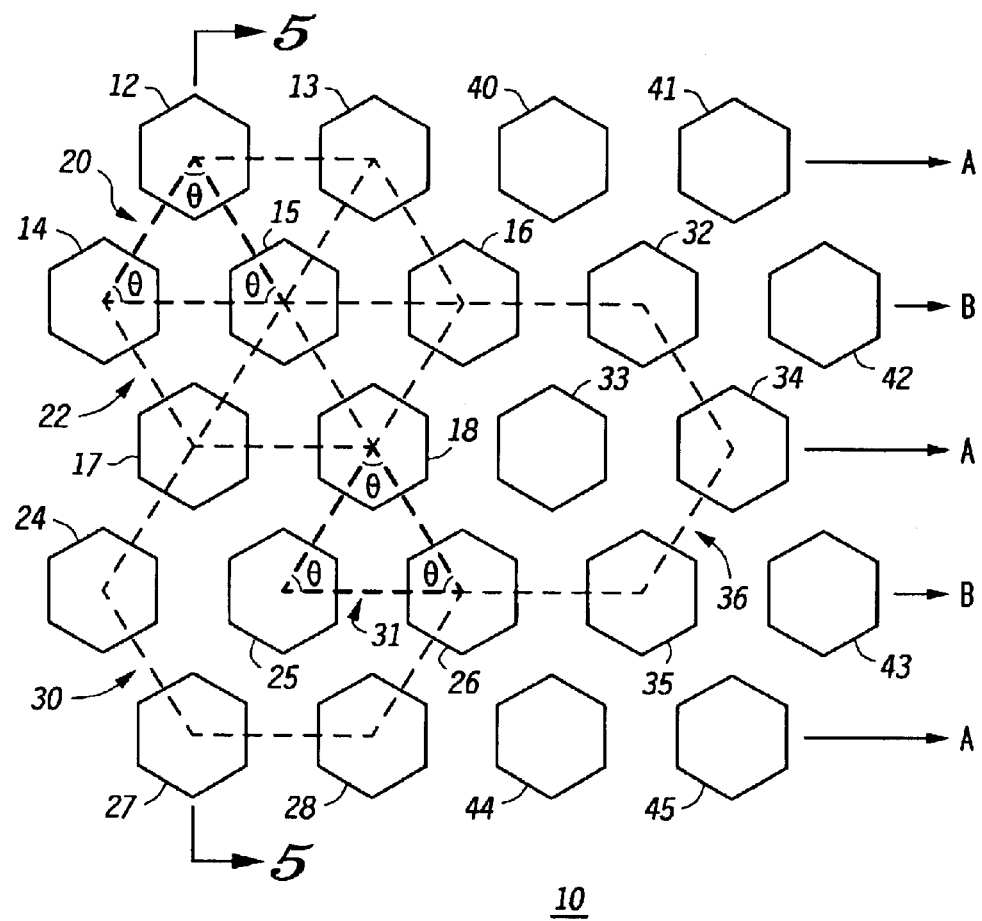
FIG. 1 illustrates in a plan view an array of interconnect stacks to form a capacitor in accordance with the present invention.

FIG. 1 illustrates a top view of an integrated vertical stack capacitor 10 outlined on a mask having a plurality of electrically conductive stacks that are arranged in an array to efficiently form a capacitor. Although the structure of each electrically conductive stack will be detailed below in connection with FIG. 3, each of the electrically conductive stacks is formed of any conductive material, such as a metal interconnect and a via. In the illustrated form, the electrically conductive stacks are arranged in predetermined hexagonal cells such as a hexagonal cell 22 illustrated by dashed lines connecting the centers of predetermined electrically conductive stacks 12, 13, 16, 18, 17 and 14 with a center electrically conductive stack 15. Additional electrically conductive stacks in capacitor 10 form another hexagonal cell 30 that includes electrically conductive stacks 26, 28, 27, 24, 17 and 18 with a center electrically conductive stack 25. Hexagonal cell 22 and hexagonal cell 30 share the electrically conductive stacks 17 and 18. Similarly, electrically conductive stacks 32, 34, 35, 44 form another hexagonal cell that shares electrically conductive stacks 26, 18 and 16 and that has a center electrically conductive stack 33.

Each of the electrically conductive stacks of a particular row of capacitor 10 is electrically connected to form either a first terminal or electrode, A, or a second terminal or electrode, B. The electrodes A and B are formed by successive alternative rows of electrically conductive stacks. These connections are referred to as terminals of the capacitor 10. For example, electrically conductive stacks 12, 13, 40 and 41 are connected together and form part of a terminal A, whereas electrically conductive stacks 24, 25, 26, 35 and 43 are connected together and form part of a terminal B. Similarly, electrically conductive stacks 14, 15, 16, 32 and 42 are connected together and form part of terminal B. Electrically conductive stacks 27, 28, 44 and 45 of the lowest illustrated row are connected together electrically and form part of terminal A. All rows forming terminal A are connected together and all rows forming terminal B are connected together.

A further characteristic of capacitor 10 is that any three adjacent electrically conductive stacks have the centers thereof forming the endpoints of an equilateral triangle. For example, electrically conductive stacks 12, 14 and 15 are centered so that the centers form a triangle 20. Triangle 20 is equilateral wherein the angle θ is substantially sixty degrees taking into consideration manufacturing variations. Similarly, an equilateral triangle is common between the center of electrically conductive stacks 13, 15 and 16, between electrically conductive stacks 15, 16, 18, between electrically conductive stacks 18, 25, 26, between electrically conductive stacks 15, 17, 18, between electrically conductive stacks 14, 15 and 17, etc. In the illustrated form, capacitive coupling is achieved by connecting alternative rows of columns to a different polarity at a desired metal layer.

By arranging the cells to have centers of any three electrically conductive stacks to be at the corners of an equilateral triangle, capacitive density of the capacitor 10 is enhanced. This is because the hexagonal arrangement of the electrically conductive stacks optimize the coupling surface areas between the A and B terminals that are available for capacitive coupling.

Figure 2:
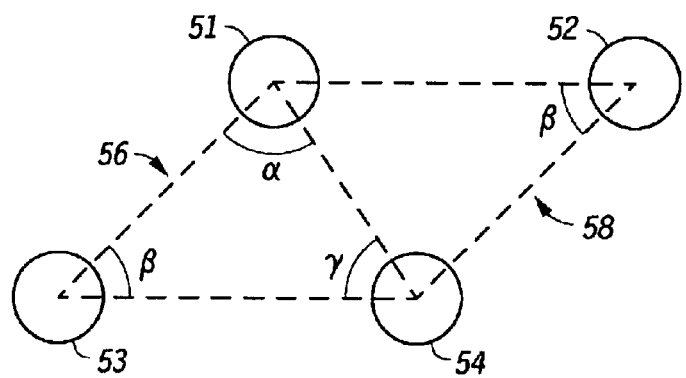
FIG. 2 illustrates in a plan view another arrangement of interconnect stacks.

FIG. 2 illustrates another form of an array of electrically conductive stacks 51–54 to form a capacitor 50. For purposes of illustration, the size of the array is reduced from the FIG. 1 illustration. For example, electrically conductive stacks 51–54 represent another form of only electrically conductive stacks 12–15 of FIG. 1. In this form, instead of using substantially hexagonally shaped electrically conductive stacks, substantially circular shaped electrically conductive stacks are used. Depending upon lithography capability, the hexagonal shapes of each of the electrically conductive stacks of FIG. 1 will translate into silicon as a substantially circular shape. In the FIG. 2 alternative form, the electrically conductive stacks define vertices of an isosceles triangle in a plane that is substantially perpendicular to the electrically conductive stacks. For example, electrically conductive stacks 51, 54 and 53 form an isosceles triangle 56 by defining vertices of the isosceles triangle. The centers of electrically conductive stacks 51, 53 and 54 form the endpoints of the isosceles triangle 56. The angles $\alpha$, $\gamma$ and $\beta$ form the angles of triangle 56 wherein any two of these angles must be equal and the remaining angle does not include a right angle, i.e. is not a ninety degree angle. By referencing a first electrically conductive stack, such as stack 51, a second electrically conductive stack, stack 53, is the first nearest neighbor of the first electrically conductive stack. A third electrically conductive stack, stack 54, is a second nearest neighbor of the first electrically conductive stack. In a special case when all three electrically conductive stacks are spaced the same distance apart, the triangle is an equilateral triangle arranged in hexagonal coordinates as described above in FIG. 1.

When an isosceles triangle is used, the electrically conductive stack 51 is physically closer to the electrically conductive stacks 53 and 54 than when an equilateral triangle is used. However, the distance between electrically conductive stacks 53 and 54 is increased. This distance change may be used to optimize the interconnect series resistance without affecting the coupling capacitance. In order to accomplish this, the dimension of all of the electrically conductive stacks may be made larger (not shown) to reduce series resistance while the coupling surfaces are maintained at a minimum spacing.

Figure 3:
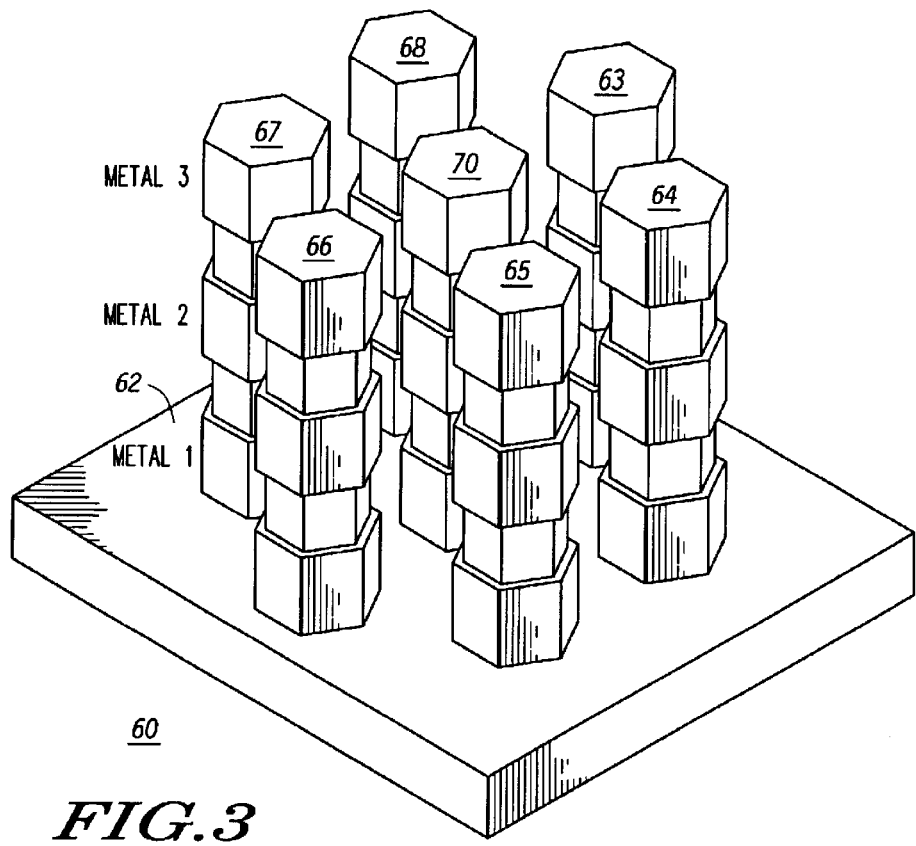
FIG. 3 illustrates in perspective view a plurality of interconnect stacks in accordance with the present invention.

Illustrated in FIG. 3 is a perspective view of a hexagonal cell 60 having seven electrically conductive stacks wherein a central electrically conductive stack 70 is surrounded by six electrically conductive stacks 63–68. Each of the electrically conductive stacks is formed on an insulating substrate 62. Each of the electrically conductive stacks is formed of a plurality of electrically conductive layers. In the illustrated form, three distinct metal layers, metal 1, metal 2 and metal 3 are connected by an electrically conductive via (not numbered).

Figure 4:
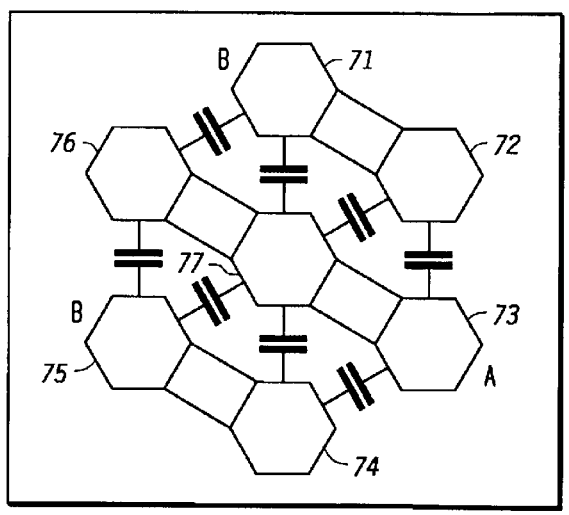
FIG. 4 illustrates a top view of the plurality of interconnect stacks of FIG. 3.

Illustrated in FIG. 4 is a top view of a hexagonal cell 69 having seven electrically conductive stacks wherein a central electrically conductive stack 77 is surrounded by six electrically conductive stacks 71–76. Each of the electrically conductive stacks is electrically connected to at least one other electrically conductive stack. For example, electrically conductive stacks 71 and 72 are connected by a conductive bus connecting the stacks to terminal B. Electrically conductive stacks 73 and 76 are connected by a conductive bus connecting the stacks to terminal A. Electrically conductive stacks 74 and 75 are connected by a conductive bus to terminal B. The coupling capacitances between terminal A and terminal B are illustrated between each of the adjoining electrically conductive stacks.

In operation, making a terminal on the same metal layer as shown is efficient. Because the terminals for both terminal A and terminal B is accomplished with a same metal layer, no additional metal layer is required for terminal construction. An advantage of making terminals on a same metal layer is that it maximizes lateral capacitive coupling and thus capacitance density. Another advantage of constructing terminals on the same metal layer also comes from the consideration that displacement current through the structure is conducted in opposing directions so that cancellation of magnetic flux occurs and parasitic self-inductance is minimized.

Figure 5:
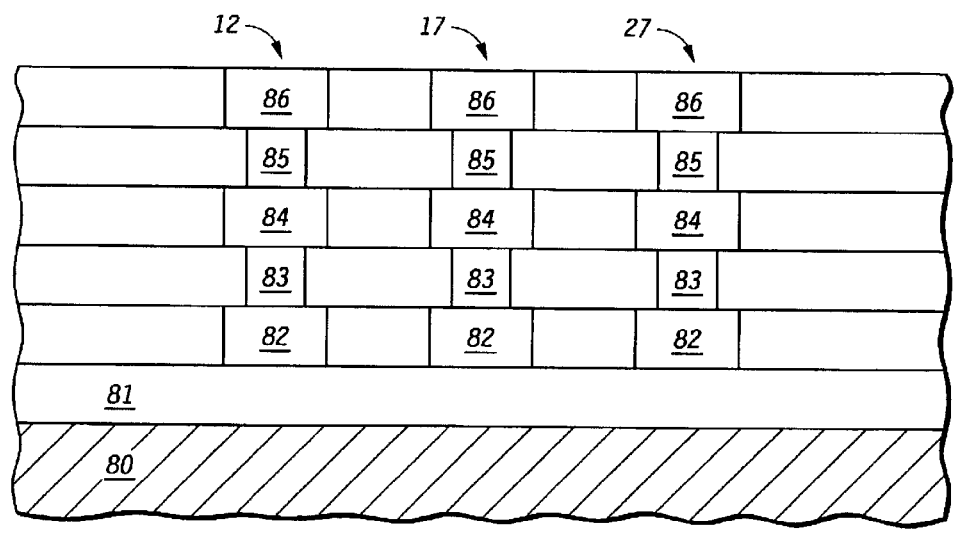
FIG. 5 illustrates a cross-sectional view of a portion of the plurality of interconnect stacks of FIG. 3.

Illustrated in FIG. 5 is a cross-section of a plurality of electrically conductive stacks 12, 17 and 27 of FIG. 1. A substrate 80 has an overlying dielectric 81. Overlying dielectric 81 is a plurality of patterned conductive layers 82–86. The layers 82–86 are formed by conventional patterning and deposition processes and will not be described in further detail.

By now it should be appreciated that there has been provided capacitor structures that optimize capacitance density and RF performance by using a non-orthogonal mask and on-chip feature symmetry. The non-orthogonal symmetry mitigates lithographic corner rounding loss and optimizes lateral capacitive coupling. Therefore, capacitive density is optimized as metal pitch dimensions become smaller. This structure also improves the precision of capacitive values and capacitor matching performance for all capacitors throughout a same integrated circuit because it is less dependent on optical proximity correction (OPC). Parasitic inductance is minimized as a result of making terminals on a same metal layer, thereby increasing the resonant frequency of the capacitor.

In the foregoing specification, the invention has been described with reference to specific embodiments. However, one of ordinary skill in the art appreciates that various modifications and changes can be made without departing from the scope of the present invention as set forth in the claims below. For example, any type of conductive material such as any metal may be used to form the electrically conductive stacks. Various dimensions may be used and the structures herein may be implemented in any type of circuit such as MOS, GaAs, etc.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. An integrated vertical stack capacitor, comprising:
   a first electrically conductive stack;
   a second electrically conductive stack, wherein the second electrically conductive stack is a first nearest neighbor of the first electrically conductive stack; and
   a third electrically conductive stack, wherein:
   the third electrically conductive stack is a second nearest neighbor of the first electrically conductive stack;
   each of the first electrically conductive stack; the second electrically conductive stack, and the third electrically conductive stack defines vertices of an isosceles triangle formed in a plane substantially perpendicular to the first, second, and third electrically conductive stacks; and
   the isosceles triangle does not include a right angle.

2. The integrated vertical stack capacitor of claim 1, wherein the first electrically conductive stack, the second electrically conductive stack, and the third electrically conductive stack defines vertices of an equilateral triangle.

3. The integrated vertical stack of claim 1, wherein each of the first electrically conductive stack, the second electrically conductive stack, and the third electrically conductive stack has a first surface, and wherein each of the vertices of the isosceles triangle corresponds to a center point of each first surface.

4. The integrated vertical stack capacitor of claim 1, wherein each of the first electrically conductive stack, the second electrically conductive stack, and the third electrically conductive stack has a first surface, wherein each first surface has a substantially circular shape.

5. The integrated vertical stack capacitor of claim 1, wherein each of the first, second, and third electrically conductive stacks has a first surface, wherein each of the first surfaces has a substantially hexagonal shape.

6. The integrated vertical stack capacitor of claim 1, wherein two of the first, second, and third electrically conductive stacks are coupled to a first terminal and another one of the first, second, and third electrically conductive stacks is coupled to a second terminal.

7. The integrated vertical stack capacitor of claim 6, wherein the first and second terminals are coplanar.

8. The integrated vertical stack capacitor of claim 1, further comprising:
   a first cell, the first cell comprising the first, second, and third electrically conductive stacks.

9. The integrated vertical stack capacitor of claim 8, further comprising:
   a second cell comprising the first electrically conductive stack, the second electrically conductive stack, and a fourth electrically conductive stack, wherein the first, second, and fourth electrically conductive stacks define vertices of a second isosceles triangle, wherein the second isosceles triangle does not include a right angle.

10. The integrated vertical stack capacitor of claim 1, wherein each of the first, second, and third electrically conductive stacks overlies and is substantially perpendicular to a substrate.

11. The integrated vertical stack capacitor of claim 1, wherein each of the first, second, and third electrically conductive stacks comprises a plurality of electrically conductive layers.

12. The integrated vertical stack capacitor of claim 11, wherein each of the plurality of electrically conductive layers of one of the first electrically conductive stack, the second electrically conductive stack, and the third electrically conductive stack is coupled to a corresponding layer of the plurality of electrically conductive layers of another one of the first electrically conductive stack, the second electrically conductive stack and the third electrically conductive stack.

13. An integrated vertical stack capacitor, comprising:
   a plurality of electrically conductive stacks having at least three electrically conductive stacks, wherein the plurality of electrically conductive stacks form an array and wherein a distance in a plane substantially perpendicular to the plurality of electrically conductive stacks between any two nearest neighbor electrically conductive stacks of the plurality of electrically conductive stacks is substantially equal.

14. The integrated vertical stack capacitor of claim 13, wherein each of the plurality of electrically conductive stacks has a first surface, wherein each first surface has a substantially circular shape.

15. The integrated vertical stack capacitor of claim 13, wherein each of the plurality of electrically conductive stacks has a first surface, wherein each first surface has a substantially hexagonal shape.

16. The integrated vertical stack capacitor of claim 13, wherein a first portion of the plurality of electrically conductive stacks are coupled to a first terminal and a second portion of the plurality of electrically conductive stacks is coupled to a second terminal.

17. The integrated vertical stack capacitor of claim 16, wherein the first portion of the plurality of electrically conductive stacks is collinear and the second portion of the plurality of electrically conductive stacks is collinear.

18. The integrated vertical stack capacitor of claim 16, wherein the first and second terminals are coplanar.

19. The integrated vertical stack capacitor of claim 16, wherein each of the plurality of electrically conductive stacks comprises a plurality of electrically conductive layers.

20. The integrated vertical stack capacitor of claim 19, wherein each of the plurality of electrically conductive layers of the first portion of the plurality of electrically conductive stacks is electrically coupled to each other, and each of the plurality of electrically conductive layers of the second portion of the plurality of electrically conductive stacks is electrically coupled to each other.

21. The integrated vertical stack capacitor of claim 13, further comprising a plurality of cells, wherein each cell comprises a first, second, and third electrically conductive stack of the plurality of electrically conductive stacks, and wherein the first, second, and third electrically conductive stack define vertices of an equilateral triangle.

22. The integrated vertical stack capacitor of claim 13, wherein each of the plurality of electrically conductive stacks overlies and is substantially perpendicular to a substrate.

* * * * *